(12) United States Patent
Mawst et al.

(10) Patent No.: US 7,256,417 B2
(45) Date of Patent: Aug. 14, 2007

(54) TYPE II QUANTUM WELL MID-INFRARED OPTOELECTRONIC DEVICES

(75) Inventors: Luke J. Mawst, Sun Prairie, WI (US); Nelson Tansu, Bethlehem, PA (US); Jerry R. Meyer, Catonsville, MD (US); Igor Vurgaftman, Odenton, MD (US)

(73) Assignee: Wisconsin Alumni Research Foundation, Madison, WI (US)

( * ) Notice: Subject to any disclaimer, the term of this patent is extended or adjusted under 35 U.S.C. 154(b) by 117 days.

(21) Appl. No.: 10/772,573

(22) Filed: Feb. 5, 2004

(65) Prior Publication Data

US 2005/0173694 A1 Aug. 11, 2005

(51) Int. Cl.
*H01L 29/205* (2006.01)
*H01S 3/103* (2006.01)

(52) U.S. Cl. ...................................................... 257/14

(58) Field of Classification Search ................ 257/14, 257/86, 87, 101, 102, 103, 614
See application file for complete search history.

(56) References Cited

U.S. PATENT DOCUMENTS

| | | | |
|---|---|---|---|
| 5,383,211 A | 1/1995 | Van de Walle et al. | |
| 5,689,123 A * | 11/1997 | Major et al. ................. | 257/190 |
| 5,793,787 A | 8/1998 | Meyer et al. | |
| 6,621,842 B1 * | 9/2003 | Dapkus .................... | 372/45.01 |
| 6,791,104 B2 * | 9/2004 | Tansu et al. .................. | 257/14 |
| 2004/0061102 A1 | 4/2004 | Tansu | |

FOREIGN PATENT DOCUMENTS

WO    WO 01/29943    4/2001

OTHER PUBLICATIONS

Peter et al. "Light-emitting diodes and laser diodes based on a Ga1-xInxAs/GaAs1-ySby" Applied Physics Letters, Apr. 5, 1999, vol. 74 Issue 14, pp. 1951-1953.*
J S Harris Jr, "GaInNAs long-wavelength lasers: progress and challenges," Semicond. Sci. Technol. 17 (2002) pp. 1-12.*
Shan et al., "Band Anticrossing in GaInNAs Alloys," Phys. Rev. Lett. vol. 82, No. 6, pp. 1221-1224 (1999).*
Press Release, "Striking Effects Of Nitrogen In Semiconductor Alloy Explained," Lawrence Berkeley National Laboratory, Jun. 9, 1999 (http://www.sciencedaily.com/releases/1999/06/990609072619.htm).*
H. C. Casey, Jr., "Temperature dependence of threshold current density on InP-$Ga_{0.28}In_{0.72}As_{0.6}P_{0.4}$ (1.3 μm) double heterostructure lasers," J. App. Phys., vol. 56 (7), 1984, pp. 1959-1964.

(Continued)

*Primary Examiner*—Thomas L. Dickey
(74) *Attorney, Agent, or Firm*—Foley & Lardner LLP

(57) ABSTRACT

Semiconductor optoelectronic devices such as diode lasers are formed on InP substrates with an active region with an InAsN or InGaAsN electron quantum well layer and a GaAsSb or InGaAsSb hole quantum well layer which form a type II quantum well. The active region may be incorporated in various devices to provide light emission at relatively long wavelengths, including light emitting diodes, amplifiers, surface emitting lasers and edge-emitting lasers.

60 Claims, 6 Drawing Sheets

OTHER PUBLICATIONS

J. R. Meyer, C. A. Hoffman, F. J. Bartoli, and L. R. Ram-Mohan, "Type II-quantum well lasers for the mid-wavelength infrared," Appl. Phys. Lett., 67 (6), 1995, pp. 757-759.

M. Kondow, T. Kitatani, S. Nakatsuka, M. C. Larson, K. Nakahara, Y. Yazawa, M. Okai, and K. Uomi, "GaInNAs : A novel material for long wavelength semiconductor lasers," IEEE J. Select. Topic Quantum Electronic., vol. 3, 1997, pp. 719-730.

A. F. Phillips, A. F. Sweeney, A. R. Adams, and P. J. A. Thijs, "Temperature Dependence of 1.3- and 1.5-$\mu$m Compressively Strained InGaAs(P) MQW Semiconductor Lasers," IEEE. J. Select. Topics Quantum Electron., vol. 5, No. 3, May/Jun. 1999, pp. 401-412.

S. Sato and S. Satoh, "1.21 $\mu$m Continuous-Wave Operation of Highly Strained GaInAs Quantum Well Lasers on GaAs Substrates," Jpn. J. Appl. Phys., vol. 38, 1999, pp. L990-L992.

F. Koyama, D. Schlenker, T. Miyamoto, Z. Chen, A. Matsutani, T. Sakaguchi, and K. Iga, "1.2 $\mu$m highly strained GaInAs/GaAs quantum well lasers for singlemode fibre datalink," Electron. Lett., 35(13), 1999, pp. 1079-1081.

D. Schlenker, T. Miyamoto, Z. Chen, F. Koyama, and K. Iga, "1.17-$\mu$m highly strained GaInAs-GaAs quantum-well laser," IEEE Photon. Technol. Lett., vol. 11(8), Aug. 1999, pp. 946-948.

J.S. Harris, Jr., "Tunable Long-Wavelength Vertical-Cavity Lasers: The Engine of Next Generation Optical Networks?" IEEE J. Select. Topics Quantum Electron., vol. 6, No. 6, Nov./Dec. 2000, pp. 1145-1160.

M. O. Fischer, M. Reindhardt, A. Forchel, "Room-temperature operation of GaInAsN-GaAs laser diodes in the 1.5-$\mu$m range," IEEE J. Select. Topic Quantum Electronic., vol. 7 (2), Mar.-Apr. 2001, pp. 149-151.

M. Kawaguchi, T. Miyamoto, E. Gouardes, D. Schlenker, T. Kondo, F. Koyama, and K. Iga, "Lasing characteristics of low threshold GaInNAs lasers grown by Metalorganic Chemical vapor Deposition", Jpn. J. Appl. Phys., vol. 40, Jul. 2001, pp. L744-L746.

N. Tansu and L. J. Mawst, "Low-Threshold Strain-Compensated InGaAs(N) ($\lambda$=1.19–1.31 $\mu$m) Quantum Well Lasers," IEEE Photon. Technol. Lett., vol. 14(4), Apr. 2002, pp. 444-446.

J.I. Malin, et al., "Type II Mid-Infrared Quantum Well Lasers," App. Phys. Lett., vol. 68, No. 21, May 20, 1996, pp. 2976-2978.

J.R. Meyer, et al., "Auger Coefficients in Type-II InAs/Ga$_{1-x}$In$_x$Sb Quantum Wells," Applied Physics Letters, vol. 73, No. 20, Nov. 16, 1998, pp. 2857-2859.

P. Dowd, et al., "Long Wavelength (1.3 and 1.5 $\mu$m) Photoluminescense fromInGaAs/GaPAsSb Quantum Wells Grown on GaAs," Applied Physics Letters, vol. 75, No. 9, Aug. 30, 1999, pp. 1267-1269.

Nelson Tansu, et al., "High-Performance Strain-Compensated InGaAs-GaAsP-GaAs ($\lambda$=1.17 $\mu$m) Quantum-Well Diode Lasers," IEEE Photonics Technology Letters, vol. 13, No. 3, Mar. 2001, pp. 179-181.

Nelson Tansu, et al., "Temperature Analysis and Characteristics of Highly Strained InGaAs-GaAsP-GaAs ($\lambda$>1.17 $\mu$m) Quantum-Well Lasers," IEEE Transactions on Quamtum Electronics, vol. 38, No. 6, Jun. 2002, pp. 640-651.

Nelson Tansu and Luke Mawst, "Design Analysis of 1550-nm GaAsSb-(In) GaAsN Type-II Quantum-Well Laser Active Regions," IEEE J. of Quantum Elec., vol. 39, No. 10, Oct. 2003, pp. 1205-1210.

I. Vurgaftman and J.R. Meyer, "(In) GaAsN-based type-II 'W' quantum-well lasers for emission at $\lambda$=1.55$\mu$m," Appl. Phys. Lett., vol. 83, No. 14, Oct. 6, 2003, pp. 2742-2744.

* cited by examiner

TYPE II QUANTUM WELL MID-INFRARED OPTOELECTRONIC DEVICES

STATEMENT OF GOVERNMENT RIGHTS

This invention was made with United States Government support awarded by the following agency: NSF 0139823. The United States Government has certain rights in this invention.

FIELD OF THE INVENTION

The present invention relates generally to the field of optoelectronic devices such as light emitting diodes and semiconductor diode lasers and more specifically to the field of type II quantum well devices.

BACKGROUND OF THE INVENTION

Fiber optic transmission of data signals across large distances is presently accomplished using a variety of laser transmitters, which generally operate at near-infrared and infrared (IR) wavelengths.

1.3 µm in-plane (edge-emitting) lasers or vertical cavity surface emitting lasers (VCSELs) operating at a modulation bandwidth of 10 Gb/s, for the metro application using single-mode fiber, will allow data transmission up to a distance of 20–30 km. J. S. Harris, Jr., "Tunable Long-Wavelength Vertical-Cavity Lasers: The Engine of Next Generation Optical Networks?" IEEE J. Select. Topics Quantum Electron., Vol. 6, No. 6, November/December 2000, pp. 1145–1160. Ideally, such devices should operate with high performance up to high temperatures (85° C.) in an uncooled environment. Long-haul fiber optic transmission requires the use of 1.55 µm sources, encouraging the development of low-cost 1.55 µm VCSELs. However, conventional InP-based long wavelength diode lasers, at $\lambda=1.3$–1.55 µm, are inherently highly temperature sensitive. As a result, additional electronics are needed to maintain the operational temperature of the lasers. This additional temperature controller leads to a significant increase in the laser packaging cost.

Longer wavelength, $\lambda>1.5$ µm, (eye safe) high power sources are also needed for laser-based radar and free-space optical links. To minimize atmospheric disturbances, these applications prefer sources in the mid-IR (2–5 µm) wavelength region. Efficient, room temperature operating mid-IR sources are also needed for the development of compact chemical sensing systems, and also for infrared countermeasures against heat-seeking missiles that threaten both military and commercial airliners. However, the strong temperature sensitivity and radiative inefficiency of conventional long-wavelength InP-, InAs-, and GaSb-based lasers severely impacts their CW (continuous wave) performance. While Quantum Cascade (QC) lasers are available for wavelengths greater than 5 µm, no diode laser sources are currently available which operate CW at room temperature in the 3–5 µm wavelength region. It would be desirable to be able to produce efficient mid-IR (2–5 µm) sources on conventional GaAs or InP substrates as compared to existing type-I and type-II quantum well (QW) lasers which utilize GaSb or InAs substrates.

The strong temperature sensitivity of conventional type-I quantum well long wavelength diode lasers stems from various physical mechanisms, including Auger recombination, large carrier leakage from the active layer, intervalence band absorption, and a strongly temperature dependent material gain parameter. A. F. Phillips, A. F. Sweeney, A. R. Adams, and P. J. A. Thijs, "Temperature Dependence of 1.3- and 1.5-µm Compressively Strained InGaAs(P) MQW Semiconductor Lasers," IEEE. J. Select. Topics Quantum Electron., Vol. 5, No. 3, May/June 1999, pp. 401–412. Typical values for the conduction-band offset for 1.3 µm InGaAsP-active region on InP-substrate lasers are ≈200 meV, which is too low to prevent severe carrier leakage from the quantum wells as well as increased Auger-assisted carrier leakage. Contrary to InP-based lasers, very large conduction band offset (470 meV) can be achieved for a 1.3 µm emitting quantum well active region with GaAs confinement layers. The large band offset helps to suppress thermally-induced carrier leakage out of the quantum well to the confining region and also the Auger-assisted carrier leakage. See J. S. Harris, Jr., "Tunable Long-Wavelength Vertical-Cavity Lasers: The Engine of Next Generation Optical Networks?" IEEE J. Select. Topics Quantum Electron., Vol. 6, No. 6, November/December 2000, pp 1145–1160 and H. C. Casey, Jr., "Temperature dependence of threshold current density on InP-$Ga_{0.28}In_{0.72}As_{0.6}P_{0.4}$ (1.3 µm) double heterostructure lasers," J. Appl. Phys., Vol. 56 (7), 1984, pp. 1959–1964.

Due to the potential advantages offered from 1.3–1.55 µm GaAs-based lasers, there have been many efforts directed towards achieving 1.3–1.55 µm emission using various types of active material on GaAs substrates. In(Ga)As quantum dots have been pursued by many different groups with various degrees of success. Quantum dot active lasers exhibit extremely low transparency current densities because of the small active volume. However, low modal gain, high temperature sensitivity, and poor modulation response are still issues under development by many groups. Other promising alternatives for 1.3–1.55 µm emission active regions include the use of GaAsSb-active materials.

An attractive approach for achieving long-wavelength laser emission on GaAs substrates is the use of highly-strained InGaAs or InGaAsN QWs. The use of highly-strained InGaAs QW active lasers to extend the emission wavelength to 1.20 µm was reported in S. Sato and S. Satoh, "1.21 µm Continuous-Wave Operation of Highly Strained GaInAs Quantum Well Lasers on GaAs Substrates," Jpn. J. Appl. Phys., Vol. 38, 1999, pp. L990–L992; F. Koyama, D. Schlenker, T. Miyamoto, Z. Chen, A. Matsutani, T. Sakaguchi, and K. Iga, "1.2 µm highly strained GaInAs/GaAs quantum well lasers for singlemode fibre datalink," Electron. Lett., 35(13), 1999, pp. 1079–1081; D. Schlenker, T. Miyamoto, Z. Chen, F. Koyama, and K. Iga, "1.17-µm highly strained GaInAs-GaAs quantum-well laser," IEEE Photon. Technol. Lett., Vol. 11 (8), August 1999, pp. 946–948. Recently, GaAsP tensile-barriers have also been implemented to strain-compensate the InGaAs quantum wells. The reduction in the bandgap of the InGaAsN materials, reported in M. Kondow, T. Kitatani, S. Nakatsuka, M. C. Larson, K. Nakahara, Y. Yazawa, M. Okai, and K. Uomi, "GaInNAs: A novel material for long wavelength semiconductor lasers," IEEE J. Select. Topic Quantum Electronic., Vol. 3, 1997, pp. 719–730, due to the presence of the N, is also followed by reduction in the compressive strain of the material due to the smaller native lattice constant of InGaN compound. Since then, many promising results have been demonstrated for 1.3 µm InGaAsN-active lasers.

Some of the highest performance InGaAsN-based lasers to date have been grown by molecular beam epitaxy (MBE). However, for manufacturing considerations such as high-throughput, the use of metal organic chemical vapor deposition (MOCVD) growth is preferable. The optimization of MOCVD grown InGaAsN materials and an understanding of growth limitations are essential to achieve this goal.

Nitrogen is usually incorporated into the InGaAs-quantum well using low temperature MOCVD growth with dimethylhydrazine as the nitrogen source. Early studies of InGaAsN-active lasers were disappointing in that nitrogen concentrations of 2–3% resulted in poor room temperature PL intensity and very high threshold current density lasers. S. Sato, "Low Threshold and High Characteristics Temperature 1.3 µm Range GaInNAs Lasers Grown by Metalorganic Chemical Vapor Deposition," Jpn. J. Appl. Phys., Vol. 39, June 2000, pp. 3403–3405. Only recently, lower MOCVD growth temperatures have been utilized to achieve higher-indium incorporation, without strain relaxation, thereby requiring smaller amounts of nitrogen to achieve 1.3 µm-emission. T. Takeuchi, Y. -L. Chang, M. Leary, A. Tandon, H. -C. Luan, D. P. Bour, S. W. Corzine, R. Twist, and M. R. Tan, "Low Threshold 1.3 µm InGaAsN Vertical Cavity Surface Emitting Lasers Grown by Metalorganic Chemical Vapor Deposition," IEEE LEOS 2001 Post-Deadline Session, San Diego, USA, November 2001; N. Tansu and L. J. Mawst, "Low-Threshold Strain-Compensated InGaAs(N) ($\lambda$=1.19–1.31 µm) Quantum Well Lasers," IEEE Photon. Technol. Lett., Vol. 14(4), April 2002, pp. 444–446; N. Tansu, N. J. Kirsch, and L. J. Mawst, "Low-Threshold-Current-Density 1300-nm Dilute-Nitride Quantum Well Lasers," Appl. Phys. Lett, Vol. 81 (14), September 2002, pp. 2523–2525; N. Tansu, A. Quandt, M. Kanskar, W. Mulhearn, and L. J. Mawst, "High-Performance and High-Temperature Continuous-Wave-Operation 1300-nm InGaAsN Quantum Well Lasers by Organometallic Vapor Phase Epitaxy," Appi. Phys. Lett., Vol. 83(1), July 2003, pp. 18–20; M. Kawaguchi, T. Miyamoto, E. Gouardes, D. Schlenker, T. Kondo, F. Koyama, and K. Iga, "Lasing characteristics of low threshold GaInNAs lasers grown by Metalorganic Chemical vapor Deposition", Jpn. J. Appl. Phys., Vol. 40, July 2001, pp. L744–L746. The smaller nitrogen content (<0.5%) in the InGaAsN-active region results in significantly improved PL intensity and reduced threshold current densities (0.225 kA/cm$^2$). N. Tansu, N. J. Kirsch, and L. J. Mawst, "Low-Threshold-Current-Density 1300-nm Dilute-Nitride Quantum Well Lasers," Appl. Phys. Lett, Vol. 81 (14), September 2002, pp. 2523–2525.

One of the challenges in growing InGaAsN QW lasers by MOCVD is the difficulty of incorporating N into the InGaAs QW, while maintaining a high optical quality film. The low purity of the N-precursor used in MOCVD (U-DMHy) is also suspected as a possible reason for the low optical quality of MOCVD-grown InGaAsN QWs. In order to incorporate sufficient N into the InGaAsN QW, very large [DMHy]/V (as high as 0.961) is required. Due to the high cost and the low purity of the DMHy precursor, lowering the [AsH$_3$]/III to achieve large [DMHy]/V would be the preferable option to increasing the DMHy flow. As a result, a large [DMHy]/V ratio requires the [AsH$_3$]/III ratio to be rather low. T. Takeuchi, Y. -L. Chang, A. Tandon, D. Bour, S. Corzine, R. Twist, M. Tan, and H. -C. Luan, "Low threshold 1.2 µm InGaAs quantum well lasers grown under low As/III ratio," Appl. Phys. Lett., Vol. 80(14), April 2002, pp. 2445–2447 has demonstrated that the growth of an InGaAs QW ($\lambda$=1200 nm) with the very low [AsH3]/III ratio is significantly more challenging compared to the case in which tertiary butyl arsine (TBA) is utilized as the As-precursor. As the [AsH$_3$]/III ratio is reduced, the luminescence of the InGaAs QW reduces rapidly for low [AsH$_3$]/III (below 15–20), which is, however, required for achieving sufficiently large [DMHy]/V. These challenges have resulted in difficulties in realizing high performance MOCVD-InGaAsN QW lasers with AsH$_3$ as the As-precursor until recently. See N. Tansu, and L. J. Mawst, "Low-Threshold Strain-Compensated InGaAs(N) ($\lambda$=1.19–1.31 µm) Quantum Well Lasers," IEEE Photon. Technol. Lett., Vol. 14(4), April 2002, pp. 444–446; N. Tansu, N. J. Kirsch, and L. J. Mawst, "Low-Threshold-Current-Density 1300-nm Dilute-Nitride Quantum Well Lasers," Appl. Phys. Lett, Vol. 81 (14) September 2002, pp. 2523–2525; N. Tansu, A. Quandt, M. Kanskar, W. Mulhearn, and L. J. Mawst, "High-Performance and High-Temperature Continuous-Wave-Operation 1300-nm InGaAsN Quantum Well Lasers by Organometallic Vapor Phase Epitaxy," Appl. Phys. Lett., Vol. 83(1), July 2003, pp. 18–20. In this approach, the design of the active region is based on strain-compensated InGaAsN QW, with very high In content (In~40%) and minimum N content (N~0.5%), to achieve 1300-nm emission. Minimum N content in the InGaAsN QW allows the growth of the active region with an optimized AsH$_3$/III ratio. Through growth optimization, the highest performance InGaAsN lasers reported to date have been obtained for lasers emitting up to 1.38 µm. N. Tansu, J. Y. Yeh, and L. J. Mawst, "Low-Threshold 1382-nm InGaAsN Quantum-Well Lasers with Metalorganic Chemical Vapor Deposition," Appl. Phys. Lett. (submitted).

While high-performance 1300-nm QW lasers have now been demonstrated by both MBE and MOCVD, a decrease in the threshold current density ($J_{th}$) of the InGaAsN QW laser is typically accompanied with a decrease in the $T_0$ value. There are several possible factors underlying the lower $T_0$ values of high-performance 1300-nm InGaAsN QW lasers. Previous work by R. Fehse, S. Tomic, A. R. Adams, S. J. Sweeney, E. P. O'Reilly, A. Andreev, H. Riechert, IEEE Select. J. Quantum Electron., 8(4), 801 (2002) without taking into account any carrier leakage, have attributed Auger recombination as the sole factor that leads to the lower $T_0$ values of the high-performance InGaAsN QW lasers. However, since these studies do not account for the possibility of carrier leakage, the Auger recombination coefficients can be overestimated. Recent studies have suggested carrier leakage as well as a temperature sensitive material gain in InGaAsN QW lasers as major contributing factors leading to the lower $T_0$ values of InGaAsN QW lasers, compared with "nitrogen-free" 1.2 µm InGaAs QW lasers. N. Tansu and L. J. Mawst, "Temperature Sensitivity of 1300-nm InGaAsN Quantum-Well Lasers," IEEE Photon. Technol. Lett., Vol. 14(8), August 2002, pp. 1052–1054; N. Tansu and L. J. Mawst, "The Role of Hole-Leakage in 1300-nm InGaAsN Quantum Well Lasers," Appl. Phys. Lett., Vol. 82(10), March 2003, pp. 1500–1502; N. Tansu, J. Y. Yeh, and L. J. Mawst, "Experimental Evidence of Carrier Leakage in InGaAsN Quantum Well Lasers," Appl. Phys. Lett., Vol. 83(11), September 2003.

These processes controlling the temperature sensitivity will become of increasing significance as the emission wavelength of the InGaAsN is extended beyond $\lambda$>1.3 µm. Recent results on higher N content InGaAsN lasers with emission wavelengths of 1.38 µm, indicate that the temperature sensitivity increases as the wavelength becomes longer. Extending the emission wavelength of InGaAsN-active lasers to 1.55 µm and beyond thus remains a considerable challenge, requiring new active layer materials or new structure designs. There have been several efforts in extending the wavelength on GaAs by utilizing highly strained InGaAsN or InGaAsN(Sb) QWs. M. O. Fischer, M. Reinhardt, A. Forchel, "Room-temperature operation of GaInAsN-GaAs laser diodes in the 1.5-µm range," IEEE J.

Select. Topic Quantum Electronic., Vol. 7 (2), March-April 2001, pp. 149–151; V. Gambin, W. Ha, M. A. Wistey, S. Bank, S. Kim, and J. S. Harris "GaInNAsSb for 1.3–1.6 μm long wavelength lasers grown by MBE," IEEE J. Quantum. Electron, Vol. 8, 2002, pp. 795–800 or InGaAs-GaAsSb type-II QWs. P. Dowd, W. Braun, D. J. Smith, C. M. Ryu, C. -Z. Guo, S. L. Chen, U. Koelle, S. R. Johnson, and Y. -H. Zhang, "Long wavelength (1.3 and 1.5 μm) photoluminescence from InGaAs/GaPAsSb quantum wells grown on GaAs," Appl. Phys. Lett., 75 (9), 1999, pp. 1267–1269. While initial results appear promising, poorer performance, compared with conventional InP-based lasers, remains an issue. The use of InGaAsN(Sb) has allowed emission wavelengths out to 1.49 μm, although those devices exhibited very high threshold current density (16 KA/cm$^2$). V. Gambin, W. Ha, M. A. Wistey, S. Bank, S. Kim, and J. S. Harris "GaInNAsSb for 1.3–1.6 μm long wavelength lasers grown by MBE," IEEE J. Quantum. Electron, Vol. 8, 2002, pp. 795–800. Furthermore, extending the emission wavelengths beyond 1.5 μm with this technology is unlikely due to the high strain of the quantum well employed. New dilute-nitride-based active layer materials are needed to enable device performance surpassing conventional InP- and GaSb-based lasers with long wavelength emission.

SUMMARY OF THE INVENTION

In accordance with the present invention, InP based optoelectronic devices have an active region that includes electron quantum well layers of semiconductor containing nitrogen, such as InAsN or InGaAsN, and a hole layer quantum well of semiconductor containing antimony, such as GaAsSb or InGaAsSb, with a type II structure. The electron quantum well layer may be in tensile or compressive strain and the hole quantum well layer is preferably in compressive strain to provide light generation at desired wavelengths. Light can be generated at relatively long mid-IR wavelengths, e.g., 2–5 μm or higher. A GaInP barrier layer is preferably formed adjacent to the InAsN or InGaAsN layer electron quantum well. The nitrogen content of the electron quantum wells is preferably relatively dilute, for example, 10% or less.

In the devices of the invention, a semiconductor structure incorporating this active region is preferably epitaxially deposited on a substrate of InP. The thicknesses of the quantum well layers may each preferably be at least about 10 Å and less than about 50 Å. The quantum well layers can be selected to provide light emission at relatively long wavelengths, e.g., in the range of 2 μm to 5 μm. The device preferably includes multiple quantum wells. Such a multiple-stage quantum well device may include a substrate comprising InP, a GaInP barrier layer, and multiple quantum well stages each of which includes InAsN or InGaAsN electron quantum well layers and a GaAsSb hole quantum well layer, each layer having appropriate strain for the desired wavelength of light emission and with the complete structure being approximately strain compensated.

The present invention may be embodied in various types of optoelectronic devices including amplifiers, light emitting diodes, and edge emitting and surface emitting lasers which incorporate optical feedback to provide lasing action.

Further objects, features and advantages of the invention will be apparent from the following detailed description when taken in conjunction with the accompanying drawings.

DETAILED DESCRIPTION OF THE INVENTION

The present invention provides a novel approach to achieving 2–5 μm lasers and other optoelectronic devices on conventional InP substrates to achieve high-performance, efficient, and room temperature operational sources. The invention utilizes a type-II active region, preferably with multiple-quantum-wells (MQWs) having a modified 'W'-shape profile, with built-in strain-compensation, strong carrier-confinement, and large electron-hole wave function overlap.

In accordance with the invention, rather than employing type-I InGaAsN quantum wells (QWs) with high N-content, longer wavelengths may be accessed more readily via type-II InAsN/GaAsSb or InGaAsN/GaAsSb structures. The energy gap in a type-II structure is governed primarily by the relative conduction and valence band alignments in the two adjacent layers rather than by the bulk gap in a single layer. The resulting flexibility comes at the expense of reduced overlap between the electron and hole wave functions that now peak in different layers. In the midwave-infrared (3–5 μm) spectral range, the so-called "W" structure is utilized, in which two electron QWs sandwich a single hole QW to maximize the type-II wave function overlap and hence the differential gain. The electron QWs are in turn bounded by barrier layers that confine both carrier types. See J. R. Meyer, C. A. Hoffman, F. J. Bartoli, and L. R. Ram-Mohan, "Type II-quantum well lasers for the mid-wavelength infrared," Appl. Phys. Lett., 67 (6), 1995, pp. 757–759. To achieve mid-IR (2–5 μm) operation from such a "W" structure, in the present invention a novel dilute-nitride type-II QW design is implemented utilizing an InP substrate. A preferred but not limiting range of nitrogen content for the electron quantum wells is 10% or less.

Figure 1:
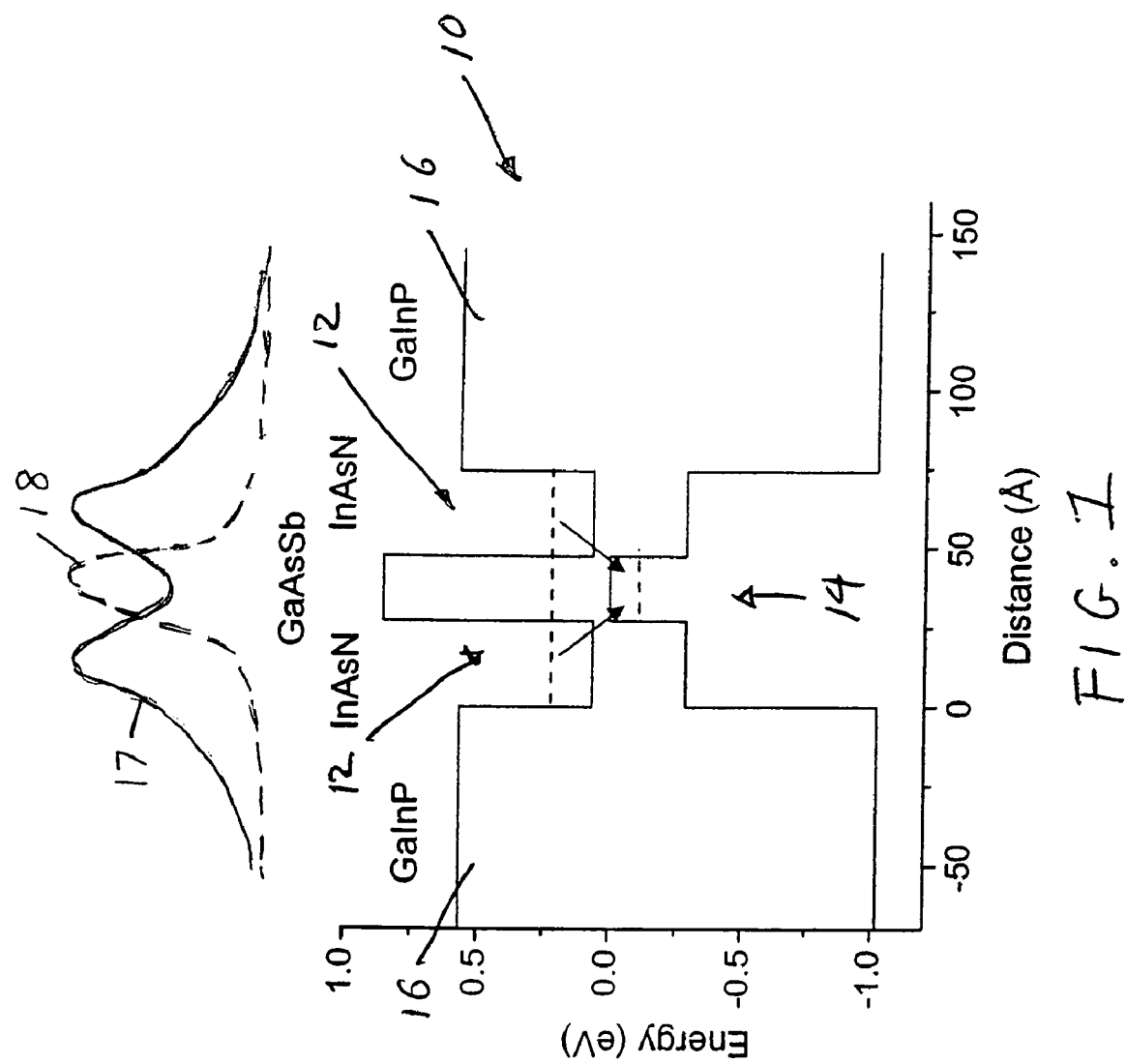
FIG. 1 is a schematic energy band diagram for an example of a single-stage type II quantum well device in accordance with the invention.

For purposes of illustrating the invention, the band diagram for one period, or stage, of an example of an optoelectronic device with an approximate 0.30-eV energy gap (λ=4.1 μm emission) at room temperature is shown at 10 in FIG. 1. This device is provided for example only, and it is understood that the invention is not limited to this example. Each of the two InAs$_{0.97}$N$_{0.03}$ (2.6% compressive strain) electron QWs 12 are 12 Å thick, and the single GaAs$_{0.35}$Sb$_{0.65}$ (1.2% compressive strain) hole QW 14 is 20 Å thick. Such a structure, in which two electron QWs surround a hole QW and two barrier layers 16 surround the electron QWs so as to maximize the wave function overlap, is referred to as a type II "W" configuration because of the shape of the conduction band profile. The advantages of the W configuration are discussed in J. R. Meyer, C. A. Hoffman, F. J. Bartoli, and L. R. Ram-Mohan, "Type II-quantum well lasers for the mid-wavelength infrared," Appi. Phys. Lett., 67 (6), 1995, pp. 757–759. See, also U.S. Pat. No. 5,793,787. In FIG. 1, the InAsN electron QWs 12 are surrounded by $In_{0.75}Ga_{0.25}P$ (1.8% tensile strained) barriers 16 (130 Å thick), which provide strain compensation. Since adequate hole confinement often becomes an issue when type-I GaAsN and InGaAsN active regions are employed, the strong confinement of both carrier types here represents an additional advantage of the type-II approach. The curves 17 and 18 in FIG. 1 illustrate the spatial profiles of the ground-state electron and hole wave functions, respectively. Energy dispersion relations, wave functions, and optical matrix elements were calculated for the device of FIG. 1 using a 10-band k·p formalism. The band anti-crossing (BAC) model was employed to incorporate a spin-degenerate nitrogen-like band that accounts for the interaction of ψ-like and N-like states in the dilute-nitride layers. Band parameters for the non-nitride and dilute-nitride materials are taken from 1. Vurgaftman and J. R. Meyer, "Band parameters for nitrogen-containing semiconductors," J. Appl. Phys. 94, 3675 (2003).

Figure 4:
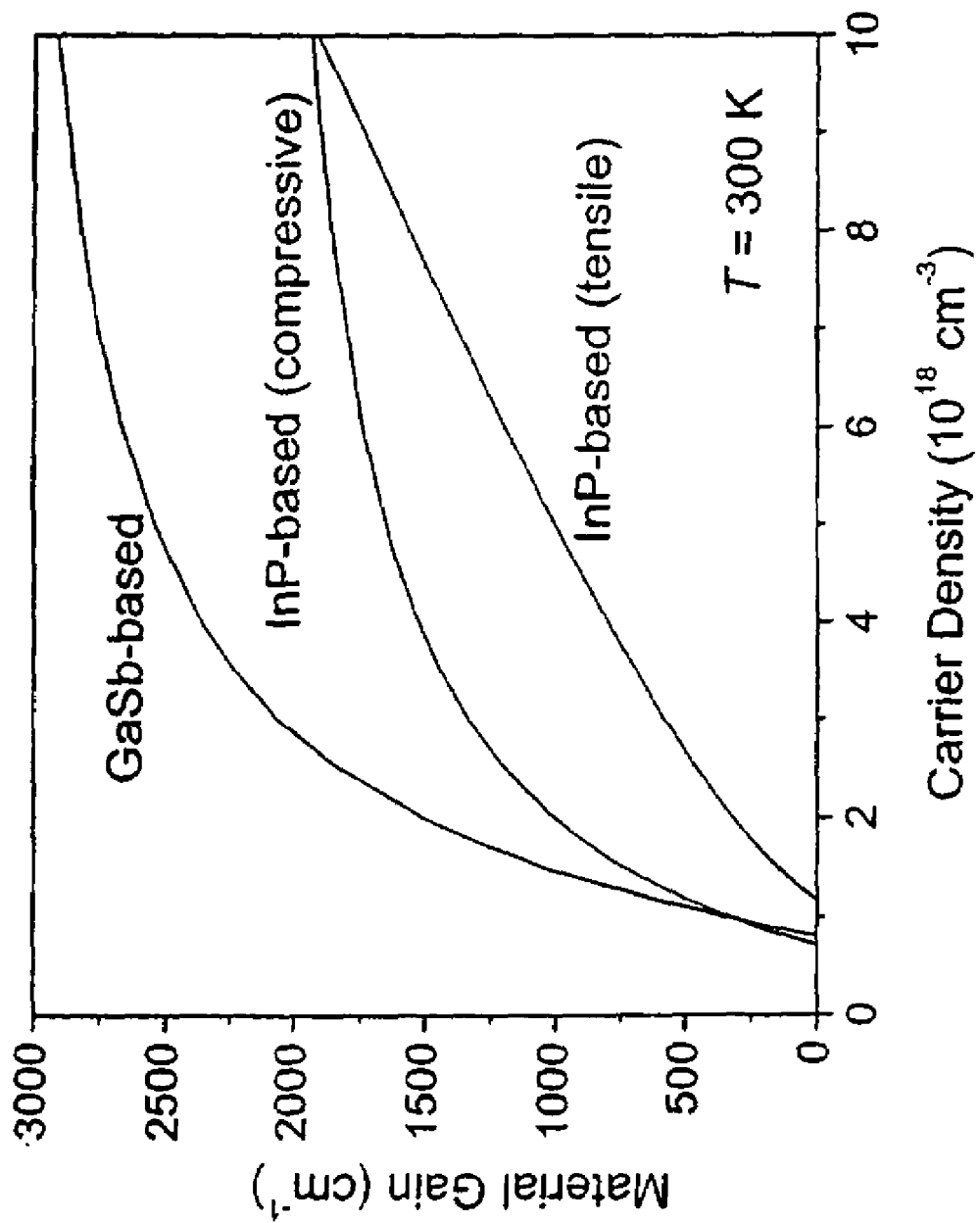
FIG. 4 are graphs showing gain calculations for devices that are GaSb-based, InP-based (compressive), and InP-based (tensile).

Using the computed subband dispersion relations and wave functions, and a Gaussian broadening linewidth of 5 meV, the optical gain and spontaneous-emission characteristics were calculated. These calculations show that the optical matrix element, which depends on the square of the electron and hole wave function overlap, is approximately 24% of that in the bulk material with the same energy gap, which is similar to that of GaSb-based type II QW structures. Optimization of the layer thicknesses is expected to produce somewhat larger optical matrix elements (i.e., higher gain). FIG. 4 illustrates the calculated gain as a function of carrier density for two variations of the structure described in FIG. 1: 1) the InP-based (compressive) case consists of a compressively strained $GaAsSb_{0.65}$ layer 14 surrounded by two $InAsN_{0.03}$ layers 12 and two GaInP barrier layers 16, and 2) the InP-based (tensile) case utilizes a tensile strained $GaAsSb_{0.35}$ layer 14 surrounded by two $InAsN_{0.05}$ layers 12 and two GaInP barrier layers 16. Both structures have tensile-strained $Ga_{0.25}InP$ as the outer layers 16 to provide strain compensation as well as a larger barrier for carrier confinement. Both structures are designed to emit near 4 µm. Also shown in FIG. 4 are the gain characteristics of a typical GaSb-based type-II QW design, for comparison purposes similar to that in J. R. Meyer, et al., supra.

The transparency carrier density for the compressively-strained InP-based QW design is similar to that of the GaSb-based design, although it exhibits lower gain at the highest carrier densities. Additional gain can, of course, be achieved by utilizing a multiple number of stages of the W-structure active region. Selection of the strain and layer thicknesses can be used to improve the gain characteristics of the InP-based design.

While the gain characteristics of devices in accordance with the invention are thus comparable to those of GaSb-based type-II QW lasers, the additional advantages of using InP substrates are significant. First, InP-based heterostructures are amenable to low-cost growth by MOCVD. While antimonides can be grown by MOCVD, the GaSb-based type II structure requires both very thin layers and layers with high Al content, which present many difficulties. In general, the antimonide processing is more difficult and less mature than InP-based device processing. At 300K, the thermal conductivity of InP is about twice that of GaSb. What may be even more significant, however, is that InP regrowth by MOCVD to bury the heterojunction can substantially improve the thermal management while providing optical confinement, whereas nothing analogous exists for the antimonides.

The semiconductor structure of the invention can utilize InP as the low refractive index cladding layers (i.e., Al-free). GaSb has a high refractive index, so it necessitates the growth of thick AlAsSb cladding layers. The high Al-content layers represent a considerable challenge for adequate facet passivation of reliable high-power lasers. Further, optical pumping is sometimes used to achieve higher performance over electrically injected devices. For optical pumping, InP is well suited in that epi-side can be mounted down and optical pumping can be done at a convenient wavelength like 980 nm without having the pump absorbed by the substrate, whereas GaSb will not pass any pump wavelengths less than about 1800 nm. This is a significant disadvantage for optically pumped antimonide Mid-IR lasers.

The MOCVD growth of InAsN is well established in prior work, and InAsN (3.5 nm thickness) with N-content as high as 34% has been reported on GaAs substrates. See H. Cao, N. Nuntawong, A. -R. A. El-Emawy, M. Osinski, "Characterization of MOCVD-grown InNAs/GaAS Quantum Wells", IEEE/OSA Conference on Lasers and ElectroOptics (CLEO), paper CFG2, 2002, pg. 653. Using MBE growth, type-I MQW InAsN/lnGaAs lasers with 3% N-content have been grown on InP substrates, with laser emission achieved at 2.38 µm. The present structures can be grown using low-pressure MOCVD.

Figure 2:
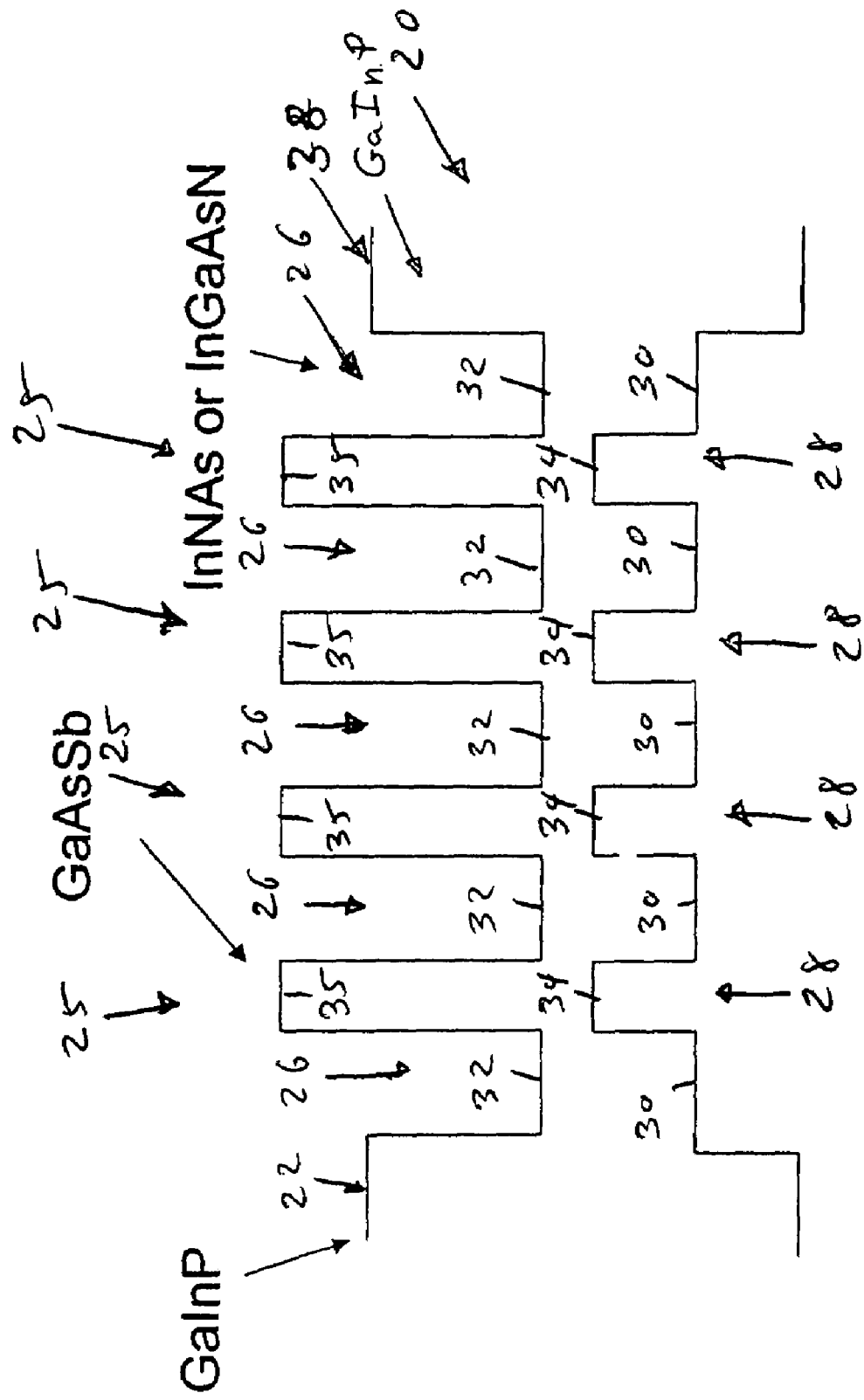
FIG. 2 is a schematic energy band diagram for a multi-stage type II quantum well device in accordance with the invention.

FIG. 2 shows a schematic energy band diagram 20 for a multiple quantum well (MQW) InP-InAsN/InGaAsN-GaAsSb active region which may be incorporated in an optoelectronic device in accordance with the invention. A GaInP barrier layer 22 is provided adjacent to a first of several quantum well stages 25 (four shown). Each stage includes electron quantum wells (QW) 26 of InAsN or InGaAsN surrounding a hole QW 28 of compressive strained GaAsSb. The electron QWs 26 have a valence band shown at 30 and a conduction band shown at 32, and the hole QWs 28 have a valence band shown at 34 and a conduction band shown at 35. The conduction band 32 of the electron wells 26 is provided by the InGaAsN or InAsN layer, while the valence band 34 of the hole-wells 28 is provided by the GaAsSb layer. The one or more stages 25 provided above the barrier layer 22 may collectively be referred to as an active region. Another barrier layer 38 of GaInP may be provided on the opposite side of the active region from the barrier layer 22. The conduction and valence bands of the electron QWs 26 and the hole QWs 28 are arranged in an offset or "zig-zag" pattern. As illustrated in FIGS. 1 and 2, the electron and hole quantum wells have a type II interface in which the ground state (lowest) electron energy level and the ground state (highest) hole energy level have wave functions concentrated in adjacent layers. By contrast, in a type I quantum well, the ground state electron and hole energy levels are in the same layer, which is to say that their wave functions are concentrated in the same layer. During operation, in the active region electrons make radiative transitions between the conduction band 32 of the electron QW 26 and the valence band 34 of the hole QW 28, recombining with holes and generating photons in the process. The zig-zag pattern is a result of the large disparity of the band lineup of the InGaAsN/InAsN and GaAsSb compositions (i.e., the compositions used to form the electron QWs 26 and the hole QWs 28).

An advantageous feature associated with the active region of FIG. 2 is strong carrier confinement, both for the electrons and holes in their respective QWs. Strong carrier confinement in the active region may allow for low device temperature sensitivity and high-output-power laser operation.

Figure 3:
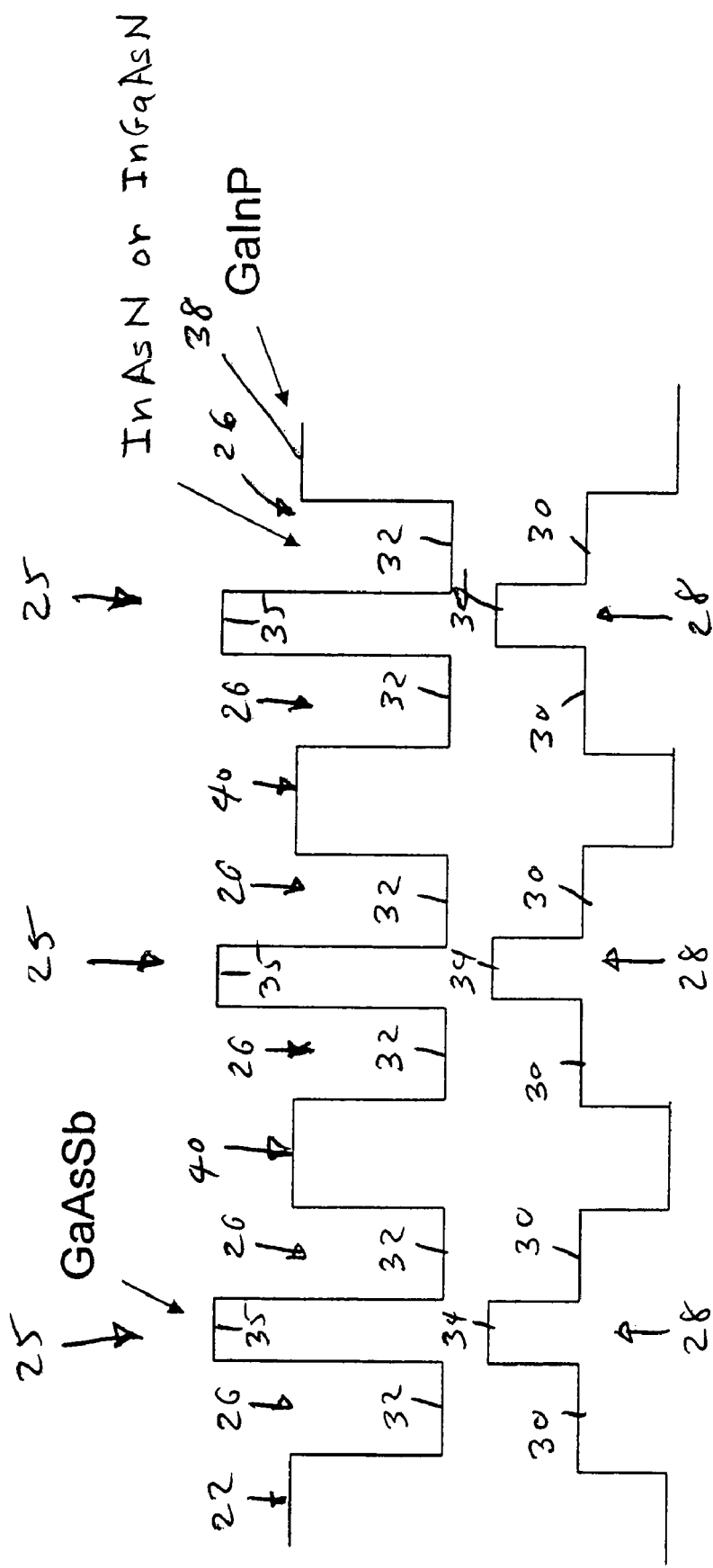
FIG. 3 is a schematic energy band diagram for a multiple stage ("W" type) type II quantum well device of the invention having GaInP transitional barriers.

The active region in the present invention may also be embodied in a partially decoupled quantum well structure, an energy band diagram for which is shown in FIG. 3. The electron quantum well layers 26 and hole quantum well layers 28 for each of the stages 25 are formed as discussed above with respect to FIG. 2. However, an additional high-bandgap barrier layer 40 of a material such as GaInP may be utilized between the stages 25 to separate the stages, as illustrated in FIG. 3, which provides a conduction band profile having a W-shaped configuration. The barrier layers 40 may also be tensile strained to help compensate the net strain. This separation of the stages preserves the two-dimensional behavior of the electron wave functions in the individual quantum well sections. If the quantum well stages 25 are strongly coupled, they behave more like a bulk (three dimensional) active layer and thereby lose certain of the benefits of a two-dimensional structure. The tradeoff incurred in using the additional high bandgap layers 40 is a lower wave function overlap between electrons and holes because the quantum well stages are decoupled.

Figure 5:
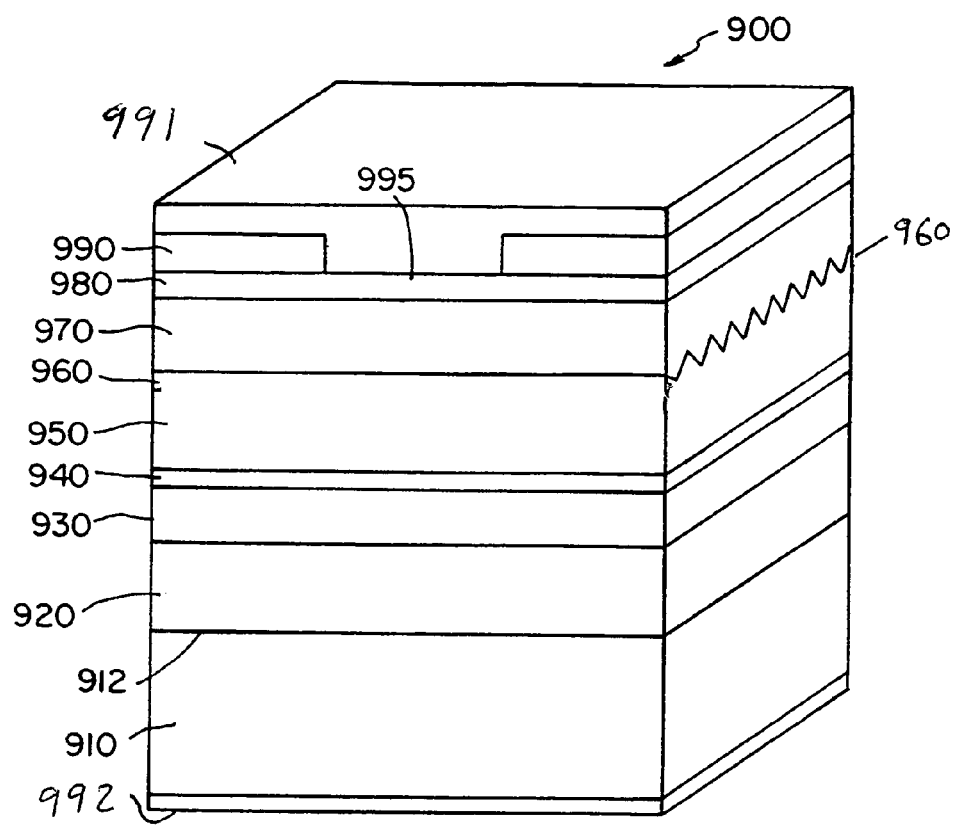
FIG. 5 is a schematic diagram of an edge-emitting laser in accordance with an exemplary embodiment of the invention.

The invention may be embodied in edge emitting and surface emitting lasers. For purposes of illustration, FIG. 5 shows a schematic diagram of a distributed feedback edge-emitting laser 900 fabricated in accordance with an exemplary embodiment of the invention. The laser 900 includes a substrate 910 of n-doped InP, a lower cladding layer 920 (e.g., n-doped InP or n-doped AlGaInAs), a lower optical confinement layer 930 (e.g., InGaAsP), an active region 940 having a multiple quantum well structure as discussed above, an upper confinement layer 950 (e.g., InGaAsP), a distributed feedback grating 960 (DFB) formed in the upper confinement layer at its interface with an upper cladding layer 970 (e.g., P-InP or p-AlGaInAs), a capping layer 980 (e.g., p-doped InGaAs), an insulating layer 990 (e.g., silicon dioxide), and electrode layers 991 and 992 preferably formed of a metal to provide electrical contacts through which voltage may be applied to generate light in the active region 940. Although a distributed feedback grating 960 is illustrated for purposes of providing optical feedback for lasing action, the present invention may be embodied in lasers having mirrored and semi-mirrored edge facets as discussed below. Lateral current confinement is provided utilizing an opening 995 in the insulating layer 990 through which current can flow from the electrode 991. However, other types of gain guiding and/or lateral confinement may be utilized. The top surface 912 of the substrate 910 may be oriented in a (100) crystallographic direction, and the various layers formed above the substrate 910 may be epitaxially grown thereon. According to alternative embodiments, other crystallographic directions for the top surface 912 and subsequent layers may be used. The epitaxially-grown layers may be provided above the substrate 910 using metal organic chemical vapor deposition (MOCVD) or molecular beam epitaxy (MBE), or other suitable epitaxial method.

Figure 6:
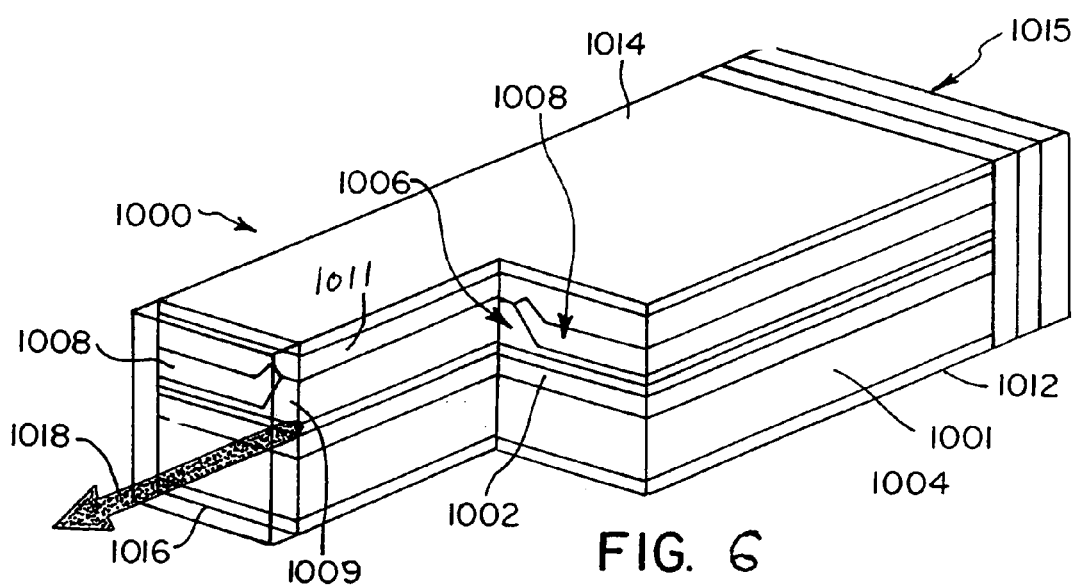
FIG. 6 is a schematic diagram of another embodiment of an edge-emitting laser in accordance with the invention.

An example of an edge emitting Fabry-Perot laser design incorporating the present invention is illustrated generally at 1000 in FIG. 6. The laser 1000 includes a substrate 1001 of InP, generally n-doped, an n-doped cladding layer 1002 (e.g., InP or AlGaInAs), a strained multiple quantum well-single confinement heterostructure (MQW-SCH) active region layer 1004 in accordance with the invention, an upper p-type cladding layer 1006 (e.g., InP or AlGaInAs), an SI-InP (Semi-insulating, Fe doped) blocking layer 1008 with a central opening 1009 therein (e.g., P-InP or P-AlGaInAs), and a cap layer 1011 (e.g., P-InGaAs). A layer of metal 1012 on the bottom surface of the substrate 1001 provides the lower electrode, and a layer of metal 1014 on the top surface of the cap layer 1011 provides the upper electrode. When voltage is applied between the upper electrode 1014 and the lower electrode 1012, current flows in the opening 1009 in the blocking layer 1008, with current being blocked elsewhere by the blocking layer 1008 and the p-type cladding layer 1006. Optical feedback to provide lasing action in the active region is provided by a high reflection coating mirror 1015 at one of the edge facets and a lower reflection coating 1016 at the other edge facet which provides partial reflection and allows a beam of light 1018 to exit from the edge facet of the laser.

Figure 7:
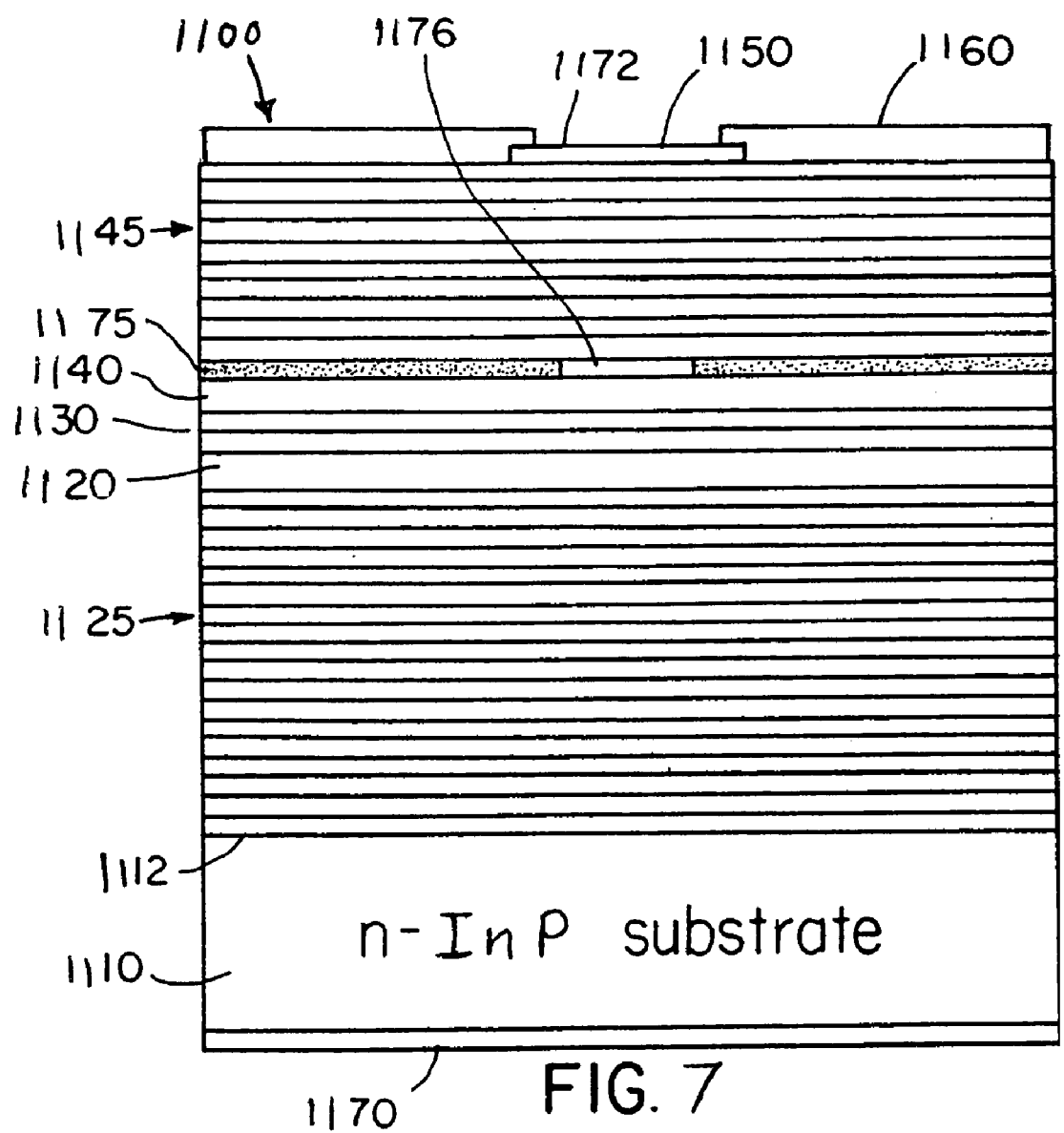
FIG. 7 is a schematic diagram of a vertical cavity surface emitting laser in accordance with the invention.

The present invention may also be implemented in surface emitting lasers (VCSELS). For example, a VCSEL may be formed having an InP substrate and an active region as discussed above, with AlGaAs/GaAs distributed Bragg reflector (DBR) regions wafer bonded to the active region. FIG. 7 is a schematic cross-sectional view of an example of the present invention embodied in a vertical cavity surface emitting laser (VCSEL) 1100. The VCSEL 1100 includes a substrate 1110 of n-doped InP, a lower confinement layer 1120 (of, e.g., InP), an active region layer 1130 having a multiple quantum well structure and a InP barrier layer as described above, an upper confinement layer 1140 (e.g., InP) and a capping layer 1150 of, e.g., InGaAs. An upper distributed p-type Bragg reflector (DBR) 1145, formed, e.g., of multiple (e.g., 22) alternating layers of $Al_xGa_{1-x}InAs/Al_yGa_{1-y}InAs$ or AlInAs/InP, and a lower n-type DBR 1125 formed of multiple (e.g., 40) alternating layers as in the DBR 1145, provide optical feedback of light in the vertical direction to provide lasing action in the active region. Electrode layers 1160 and 1170 are formed on the top and bottom surfaces of the structure, respectively, of metal (e.g., Ti/Pt/Au or AuGaNiAu) to provide electrical contacts by which voltage may be applied to the VCSEL 1100 to generate lasing in the active region. An aperture or opening 1172 is formed in the electrode layer 1100 through which a light beam may be emitted. A layer of oxidized AlAs or oxidized AlInAs 1175 with an opening 1176 (of the same material unoxidized) therein interposed between the upper confinement layer 1140 and the upper DBR 1145 to confine current flow through the opening 1176 and provide light generation in the active region under the opening. The top surface 1112 of the substrate 1110 may be oriented in a desired crystallographic direction, and the various layers formed above the substrate 1110 can be epitaxially grown thereon in a conventional fashion. According to alternative embodiments, other crystallographic directions for the top surface 1112 and subsequent layers may be used. The epitaxially-grown layers may be provided above the substrate 1110 using, for example, metal organic chemical vapor deposition (MOCVD) or molecular beam epitaxy (MBE).

The present invention having an active region as discussed above may be embodied in various types of opto-electronic devices and is not limited to diode lasers. Examples of such other devices include light emitting diodes, amplifiers, and gain sections for external cavities. Such devices may have structures similar to those discussed above for exemplification with respect to diode lasers but without structures for providing optical feedback for lasing action.

It should be understood that the invention is not limited to the embodiments set forth herein as illustrative, but embraces all such forms thereof as come within the scope of the following claims.

What is claimed is:

1. An optoelectronic device comprising:
   a multilayer semiconductor structure including an InP substrate and an active region, the active region comprising at least a hole quantum well layer of a semiconductor containing antimony and at least one electron quantum well layer adjacent to the hole quantum well layer which comprises a semiconductor containing nitrogen to provide a type II quantum well structure, wherein the semiconductor containing nitrogen is InAsN.

2. The device of claim 1 wherein there is an electron quantum well layer on each side of the hole quantum well layer and there is a barrier layer adjacent to each electron quantum well layer on each side of the hole quantum well layer to provide a conduction band profile for the active region having a W-shaped configuration.

3. The device of claim 2 wherein the electron quantum well layers are in compressive strain and the hole quantum well layer is in compressive strain.

4. The device of claim 2 wherein the electron quantum well layers are in compressive strain and the hole quantum well layer is in tensile strain.

5. The device of claim 2 wherein the thickness of each electron quantum well layer and hole quantum well layer is between approximately 10 and 50 angstroms.

6. The device of claim 2 wherein the barrier layers comprise GaInP.

7. The device of claim 1 wherein the electron quantum well layers and hole quantum well layer form a first quantum well stage, and wherein the active region comprises a plurality of quantum well stages adjacent to each other each having electron quantum well layers surrounding a hole quantum well layer.

8. The device of claim 7 including a barrier layer between each quantum well stage to provide a conduction band profile having a W-shaped configuration.

9. The device of claim 8 wherein the barrier layer between each quantum well stage comprises GaInP.

10. The device of claim 1 including means for providing optical feedback to form an edge-emitting laser.

11. The device of claim 1 including means for providing optical feedback to form a vertical cavity surface emitting laser.

12. The device of claim 1 wherein the active region generates light having a wavelength greater than approximately 2 µm.

13. The device of claim 1 wherein the active region generates light having a wavelength of approximately 3 µm.

14. The device of claim 1 wherein the nitrogen content of the electron quantum well is 10% or less.

15. The device of claim 1 wherein there is an electron quantum well layer on each side of the hole quantum well layer and there is an optical confinement layer adjacent to each electron quantum well layer, the optical confinement layers comprising InP or InGaAsP.

16. The device of claim 1 wherein there is an electron quantum well layer on each side of the hole quantum well layer and there is a cladding layer adjacent to each electron quantum well layer, the cladding layers comprising InP or AlGaInAs.

17. An optoelectronic device comprising:
    a multilayer semiconductor structure including an InP substrate and an active region, the active region comprising at least a hole quantum well layer of a semiconductor containing antimony and at least one electron quantum well layer adjacent to the hole quantum well layer which comprises a semiconductor containing nitrogon to provide a type II quantum well structure, wherein there is an electron quantum well layer on each side of the hole quantum well layer and there is a barrier layer adjacent to each electron guantum well layer on each side of the hole quantum well layer to provide a conduction band profile for the active region having a W-shaped configuration, and further wherein there is an optical confinement layer adjacent to each barrier layer, the optical confinement layers comprising InP.

18. An optoelectronic device comprising:
    a multilayer semiconductor structure including an InP substrate and an active region, the active region comprising at least a hole quantum well layer that is an InGaAsSb layer and an electron quantum well layer of InAsN or InGaAsN on each side of the hole quantum well layer to provide a type II quantum well structure.

19. The device of claim 18 wherein the electron quantum well layers are in compressive strain and the hole quantum well layer is in compressive strain.

20. The device of claim 18 wherein the thickness of each electron quantum well layer and hole quantum well layer is between approximately 10 and 50 angstroms.

21. The device of claim 18 including a barrier layer adjacent to each electron quantum well layer to form a conduction band profile having a W-shaped configuration.

22. The device of claim 21 wherein the barrier layer comprises GaInP.

23. The device of claim 18 wherein the electron quantum well layers and hole quantum well layer form a first quantum well stage, and wherein the active region comprises a plurality of quantum well stages adjacent to each other.

24. The device of claim 18 wherein the percentage of Ga content of the electron quantum well layers is no more than 30%.

25. The device of claim 18 including means for providing optical feedback to form an edge-emitting laser.

26. The device of claim 18 including means for providing optical feedback to form a vertical cavity surface emitting laser.

27. The device of claim 18 wherein the nitrogen content of the electron quantum wells is 10% or less.

28. The device of claim 18 wherein the electron quantum well layer is a InAsN layer.

29. The device of claim 18 wherein there is an optical confinement layer adjacent to each electron quantum well layer, the optical confinement layer comprising InP or lnGaAsP.

30. The device of claim 18 wherein there is a cladding layer adjacent to each electron quantum well layer, the cladding layer comprising InP or AlGaInAs.

31. A semiconductor laser comprising:
    (a) a multilayer semiconductor structure including an InP substrate and an active region, the active region comprising at least a hole quantum well layer of a semiconductor containing antimony and at least one electron quantum well layer adjacent to the hole quantum well layer which comprises a semiconductor containing nitrogen to provide a type II quantum well structure, wherein the semiconductor containing antimony is InGaAsSb; and (b) means for providing optical feedback to provide lasing action in the active region, wherein the semiconductor containing antimony is InGaAsSb.

32. An optoelectonic device comprising:
a multilayer semiconductor structure including an InP substrate and an active region, the active region comprising at least a hole quantum well layer of a semiconductor containing antimony and at least one electron quantum well layer adjacent to the hole quantum well layer which comprises a semiconductor containing nitrogen to provide a type II quantum well structure, wherein the semiconductor containing antimony is InGaAsSb.

33. A semiconductor laser comprising:
(a) a multilayer semiconductor structure including an InP substrate and an active region, the active region comprising at least a hole quantum well layer of a semiconductor containing antimony and at least one electron quantum well layer adjacent to the hole quantum well layer which comprises a semiconductor containing II quantum well structure; and (b) means for providing optical feedback to provide lasing action in the active region, wherein there is an electron quantum well layer on each side of the hole quantum well layer and there is a barrier layer adjacent to each electron quantum well layer on each side of the hole quantum well layer to provide a conduction band for the active region having a W-shaped configuration, and further wherein the electron quantum well layers and hole quantum well layer form a first quantum well stage, and wherein the active region comprises a plurality of quantum well stage adjacent to each other each having electron quantum well layers surrounding a hole quantum well layer, the laser further including a baffler layer of GaInP between each quantum well stage.

34. An optoelectronic device comprising: a multi-layer semiconductor structure including an InP substrate and an active region, the active region comprising at least a hole quantum well layer of GaAsSb or InGaAsSb and an electron quantum well layer of InAsN or InGaAsN on each side of the hole quantum well layer to provide a type II quantum well structure, wherein the electron quantum well layers and the hole quantum well layer form a first quantum well stage, and wherein the active region comprises a plurality of quantum well stages adjacent to each other, the device further including a barrier layer of GaInP between each quantum well stage to form a conduction band profile having a W-shaped configuration.

35. An optoelectonic device comprising:
a multilayer semiconductor structure including an InP substrate and an active region, the active re lion comprising at least a hole quantum well layer of GaAsSb and a electron quantum well layer of InAsN on each side of the hole quantum well layer to provide a type II quantum well structure wherein the electron quantum well layers are in compressive strain and the hole quantum well layer is in compressive strain.

36. The device of claim 35 wherein the electron quantum well layers are lattice matched to InP.

37. The device of claim 35 wherein the thickness of each electron quantum well layer and hole quantum well layer is between approximately 10 and 50 angstroms.

38. The device of claim 35 including a barrier layer adjacent to each electron quantum well layer to form a conduction band profile having a W-shaped configuration.

39. The device of claim 38 wherein the barrier layers comprise GaInP.

40. The device of claim 35 wherein the electron quantum well layers and hole quantum well layer form a first quantum well stage, and wherein the active region comprises a plurality of quantum well stages adjacent to each other.

41. The device of claim 35 including a transitional layer of GaInP between each quantum well stage.

42. The device of claim 35 including means for providing optical feedback to form an edge-emitting laser.

43. The device of claim 35 including means for providing optical feedback to form a vertical cavity surface emitting laser.

44. The device of claim 35 wherein the active region generates light having a wavelength greater than approximately 2 μm.

45. The device of claim 35 wherein the active region generates light having a wavelength of approximately 3 μn.

46. The device of claim 35 wherein the nitrogen content of the electron quantum wells is 10% or less.

47. A semiconductor laser comprising:
(a) a multilayer semiconductor structure including an InP substrate and an active region, the active region comprising at least a hole quantum well layer of a semiconductor containing antimony and at least one electron quantum well layer adjacent to the hole quantum well layer which comprises a semiconductor containing nitrogen to provide a type II quantum well structure, wherein the semiconductor containing nitrogen is InAsN; and (b) means for providing optical feedback to provide lasing action in the active region.

48. The laser of claim 47 wherein there is an electron quantum well layer on each side of the hole quantum well layer and there is a barrier layer adjacent to each electron quantum well layer on each side of the hole quantum well layer to provide a conduction band profile for the active region having a W-shaped configuration.

49. The laser of claim 48 wherein the electron quantum well layers are in compressive strain and the hole quantum well layer is in compressive strain.

50. The laser of claim 48 wherein the electron quantum well layers are in compressive strain and the hole quantum well layer is in tensile strain.

51. The laser of claim 48 wherein the thickness of each electron quantum well layer and hole quantum well layer is between approximately 10 and 50 angstroms.

52. The laser of claim 48 wherein the baffler layer comprises GaInP.

53. The laser of claim 48 wherein there is an optical confinement layer adjacent to each barrier layer, the optical confinement layer comprising InP.

54. The laser of claim 48 wherein the electron quantum well layers and hole quantum well layer form a first quantum well stage, and wherein the active region comprises a plurality of quantum well stages adjacent to each other each having electron quantum well layers surrounding a hole quantum well layer.

55. The laser of claim 47 wherein the means for providing optical feedback forms an edge-emitting laser.

56. The laser of claim 47 wherein the means for providing optical feedback forms a vertical cavity surface emitting laser.

57. The laser of claim 47 wherein the active region generates light having a wavelength greater than approximately 2 μm.

58. The laser of claim 47 wherein the active region generates light having a wavelength of approximately 3 μm.

59. The laser of claim 47 wherein the nitrogen content of the electron quantum wells is 10% or less.

60. The laser of claim 47 wherein there is an electron quantum well layer on either side of the hole quantum well layer and there is a cladding layer adjacent to each electron quantum well layer, the cladding layer comprising InP or AlGaInAs.

* * * * *

UNITED STATES PATENT AND TRADEMARK OFFICE
CERTIFICATE OF CORRECTION

| | |
|---|---|
| PATENT NO. | : 7,256,417 B2 |
| APPLICATION NO. | : 10/772573 |
| DATED | : August 14, 2007 |
| INVENTOR(S) | : Luke J. Mawst et al. |

It is certified that error appears in the above-identified patent and that said Letters Patent is hereby corrected as shown below:

Col. 3, lines 31-32:

Delete "Appi. Phys. Lett." and replace it with --Appl. Phys. Lett.--.

Col. 7, line 23:

Delete "$\psi$-like" and replace it with --$\Gamma$-like--.

Claim 16, Col. 12, line 1:

Delete "adjacent to ea h" and replace it with --adjacent to each--.

Claim 17, Col. 12, line 14:

Delete the word "guantum" and replace it with --quantum--.

Claim 33, Col. 13, lines 24-25:

Insert the words "nitrogen too provide a type" between "containing" and "II quantum well structure" to read --containing nitrogen to provide a type II quantum well structure;--.

Claim 33, Col. 13, line 38:

Delete the phrase "including a baffler" and replace it with --including a barrier--.

Claim 35, Col. 13, line 55:

Delete "re lion" and replace it with --region--.

UNITED STATES PATENT AND TRADEMARK OFFICE
CERTIFICATE OF CORRECTION

PATENT NO. : 7,256,417 B2
APPLICATION NO. : 10/772573
DATED : August 14, 2007
INVENTOR(S) : Luke J. Mawst et al.

It is certified that error appears in the above-identified patent and that said Letters Patent is hereby corrected as shown below:

Claim 45, Col. 14, line 21:

Delete "3 $\mu$n" and replace it withh --3 $\mu$m--.

Signed and Sealed this

Fifteenth Day of April, 2008

JON W. DUDAS
*Director of the United States Patent and Trademark Office*